(12) United States Patent
Shimatani (10) Patent No.: US 10,678,129 B2
(45) Date of Patent: Jun. 9, 2020

(54) COMPOSITION FOR NANOIMPRINT, CURED PRODUCT, PATTERN FORMING METHOD, AND ARTICLE HAVING PATTERN

(71) Applicant: TOKYO OHKA KOGYO CO., LTD., Kawasaki-shi (JP)

(72) Inventor: Satoshi Shimatani, Tokyo (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 328 days.

(21) Appl. No.: 15/173,925

(22) Filed: Jun. 6, 2016

(65) Prior Publication Data

US 2016/0363858 A1 Dec. 15, 2016

(30) Foreign Application Priority Data

Jun. 15, 2015 (JP) .................................. 2015-120484

(51) Int. Cl.
| | | |
|---|---|---|
| G03F 7/00 | (2006.01) | |
| G03F 7/031 | (2006.01) | |
| G03F 7/033 | (2006.01) | |

(52) U.S. Cl.
CPC ............ *G03F 7/0002* (2013.01); *G03F 7/031* (2013.01); *G03F 7/033* (2013.01)

(58) Field of Classification Search
CPC ........ G03F 7/0002; G03F 7/031; G03F 7/033; G03F 7/0004; G03F 7/028; G03F 7/70; H01L 21/0274; H01L 21/7806
See application file for complete search history.

(56) References Cited

U.S. PATENT DOCUMENTS

| | | | |
|---|---|---|---|
| 5,331,057 A | 7/1994 | Brekner et al. | |
| 6,121,340 A * | 9/2000 | Shick | C08G 61/08 430/270.1 |
| 6,193,898 B1 | 2/2001 | Kano et al. | |
| 6,232,417 B1 * | 5/2001 | Rhodes | C08G 61/08 526/171 |
| 7,022,790 B2 * | 4/2006 | Elce | C08G 59/3218 526/281 |
| 7,422,836 B2 * | 9/2008 | Rhodes | C08F 232/08 430/270.1 |

(Continued)

FOREIGN PATENT DOCUMENTS

| | | |
|---|---|---|
| CA | 2077411 A1 | 3/1993 |
| JP | 05-255566 A | 10/1993 |

(Continued)

OTHER PUBLICATIONS

Office Action issued in Japanese Patent Application No. 2015-120484, dated Mar. 5, 2019.

(Continued)

*Primary Examiner* — Sanza L. McClendon
(74) *Attorney, Agent, or Firm* — Knobbe Martens Olson & Bear LLP (57) ABSTRACT

A composition for nanoimprint including a cycloolefin-based copolymer; a polymerizable monomer; and a photoinitiator. The polymerizable monomer of the present invention may include a polyfunctional monomer, and the cycloolefin-based copolymer may include a constituent unit having a cyclic olefin and a constituent unit having an acyclic olefin.

7 Claims, 2 Drawing Sheets

(56) References Cited

U.S. PATENT DOCUMENTS

| | | | |
|---|---|---|---|
| 2008/0138248 A1* | 6/2008 | Viovy | B01L 3/502707 422/400 |
| 2009/0057960 A1* | 3/2009 | Kashiwagi | B29C 33/40 264/488 |
| 2011/0073901 A1* | 3/2011 | Fujita | C09J 7/24 257/100 |
| 2012/0080826 A1 | 4/2012 | Saito | |
| 2012/0175822 A1* | 7/2012 | Inamiya | B29C 59/022 264/479 |
| 2014/0073901 A1* | 3/2014 | Villegas | A61B 5/0059 600/407 |
| 2017/0090293 A1* | 3/2017 | Nakata | B01D 67/003 |

FOREIGN PATENT DOCUMENTS

| | | |
|---|---|---|
| JP | 05-339327 A | 12/1993 |
| JP | 11-119013 A | 4/1999 |
| JP | 2011-003672 A | 1/2011 |
| JP | 2011-178052 A | 9/2011 |
| JP | B-5560049 | 7/2014 |
| JP | 2015-071741 A | 4/2015 |

OTHER PUBLICATIONS

Office Action issued in Taiwanese Patent Application No. 105118419, dated Sep. 19, 2019.

\* cited by examiner

COMPOSITION FOR NANOIMPRINT, CURED PRODUCT, PATTERN FORMING METHOD, AND ARTICLE HAVING PATTERN

RELATED APPLICATION

This application claims priority to Japanese Patent Application No. 2015-120484, filed Jun. 15, 2015, the entire content of which is incorporated herein by reference

BACKGROUND OF THE INVENTION

Field of the Invention

The present invention relates to a composition for nanoimprint, a cured product, a pattern forming method, and an article having the pattern.

Priority is claimed on Japanese Patent Application No. 2015-120484, filed on Jun. 15, 2015, the contents of which are incorporated herein by reference.

Description of Related Art

A lithography technology is a core technology of a semiconductor device process, and further miniaturization of wiring has been promoted with high integration of a semiconductor integrated circuit (IC) in recent years. As the miniaturization method, a method of shortening the wavelength of a light source by means of using a light source having a shorter wavelength such as a KrF excimer laser, an ArF excimer laser, an $F_2$ laser, extreme ultraviolet light (EUV), electron beams (EB), or X-rays or a method of making the diameter of a numerical aperture (NA) of a lens of an exposure device large (making the NA large) is typically exemplified.

In these circumstances, a nanoimprint method in which a mold on which a predetermined pattern is formed is pressed against a substrate to be transferred that is formed with a resin layer on the surface thereof (pattern forming layer) and the pattern of the mold is transferred to the resin layer has been suggested.

The nanoimprint method is a technology of pressing a mold, formed with a nanometer-sized uneven pattern on the surface thereof in advance, against a resin layer formed by being applied to the surface of a substrate to be transferred such as a semiconductor wafer, mechanically deforming the resin layer so that the uneven pattern is transferred, and processing the substrate to be transferred using the pattern-transferred resin layer as a sacrificial film.

As such a nanoimprint method, a thermal imprint method of transferring an uneven pattern through heat using a thermoplastic resin or an optical imprint method of transferring an uneven pattern through ultraviolet rays using a photo-curing resin is known.

A resin layer formed by being applied to the surface of a substrate to be transferred is required to have flexibility that allows an uneven pattern of a mold to be transferred when the mold is pressed. Meanwhile, in a case where a substrate to be transferred is processed by performing etching processing using a pattern-transferred resin layer as a sacrificial film, the resin layer is required to have high etching resistance.

For example, an example in Japanese Patent No. 5560049 describes a method of forming two different resin layers on a substrate to be transferred, as a nanoimprint method satisfying the above-described requirements. Japanese Patent No. 5560049 describes a method of forming an organic layer formed of diamond-like carbon (DLC) having excellent etching resistance on a substrate to be transferred and then forming a resin layer that includes a siloxane polymer having flexibility that allows an uneven pattern of a mold to be transferred to the organic layer.

The method described in Japanese Patent No. 5560049 is a method of providing flexibility that allows a pattern to be transferred and etching resistance for respective resin layers by means of forming two resin layers as described above.

SUMMARY OF THE INVENTION

In a nanoimprint method of the related art as described in Japanese Patent No. 5560049, it is necessary to form two resin layers. Meanwhile, from the viewpoint of improving production efficiency, it is preferable to achieve both of etching resistance and flexibility that allows a pattern to be transferred by forming a single-layered resin layer.

The present invention has been made in consideration of the above-described problems, and an object thereof is to provide a composition for nanoimprint, which is capable of forming a nanoimprint pattern in which high etching resistance and flexibility that allows an uneven pattern of a mold to be transferred are both achieved, and a pattern forming method using the composition for nanoimprint.

According to a first aspect of the present invention, there is provided a composition for nanoimprint including: a cycloolefin-based copolymer; a polymerizable monomer; and a photoinitiator.

According to a second aspect of the present invention, there is provided a cured product which is formed by curing the composition for nanoimprint according to the first aspect of the present invention.

According to a third aspect of the present invention, there is provided a pattern forming method including: coating a substrate with the composition for nanoimprint according to the first aspect of the present invention to form a pattern forming layer; pressing a mold, on which an uneven structure having a predetermined pattern is formed, to the pattern forming layer and deforming the pattern forming layer to the predetermined pattern; exposing the pattern forming layer to light in a state where the mold is pressed; and peeling the mold pressed to the pattern forming layer.

According to a fourth aspect of the present invention, there is provided an article which has a pattern obtained using the pattern forming method according to the third aspect of the present invention.

According to the present invention, it is possible to provide a composition for nanoimprint, which is capable of forming a nanoimprint pattern in which high etching resistance and flexibility that allows an uneven pattern of a mold to be transferred are both achieved, and a pattern forming method using the composition for nanoimprint.

DETAILED DESCRIPTION OF THE INVENTION

Composition for Nanoimprint

A composition for nanoimprint of the present invention is used for an optical imprint method and used to form a fine pattern on a substrate according to a nanoimprint technology. The term "nanoimprint" in the present invention indicates pattern transfer having a size of approximately several nanometers to several micrometers and is not limited to the nano order.

The composition for nanoimprint of the present invention contains a cycloolefin-based copolymer, a polymerizable monomer, and a photoinitiator. Hereinafter, an embodiment of a composition for nanoimprint of a first aspect of the present invention will be described.

Cycloolefin-Based Copolymer

First, a cycloolefin-based copolymer (hereinafter, also referred to as a "component (A)") will be described.

The component (A) contained in the composition for nanoimprint of the present embodiment is an amorphous polymer that includes a constituent unit having a cyclic olefin structure, and it is preferable that the component (A) has a constituent unit having an acyclic olefin structure in addition to the constituent unit having a cyclic olefin structure.

Constituent Unit having Cyclic Olefin It is preferable that the constituent unit having a cyclic olefin (hereinafter, also referred to as a "constituent unit (CO)") is any of a constituent unit derived from a compound represented by any of the following Formulae (CO)-A-1 to (CO)-A-7 (hereinafter, referred to as a "constituent unit (CO)-A") and a constituent unit derived from a diene compound (hereinafter, referred to as a "constituent unit (CO)-B").

Constituent Unit (CO)-A

The constituent unit (CO)-A is a constituent unit derived from a compound represented by any of the following Formulae (CO)-A-1 to (CO)-A-7.

(CO)-A-1

(CO)-A-2

(CO)-A-3

[In Formulae (CO)-A-1 to (CO)-A-3, $R^1$ to $R^6$ each independently represent a hydrogen atom or a hydrocarbon group having 1 to 20 carbon atoms.]

(CO)-A-4

(CO)-A-5

(CO)-A-6

(CO)-A-7

[In Formulae (CO)-A-4 to (CO)-A-7, $R^1$ to $R^8$ each independently represent a hydrogen atom or a hydrocarbon group having 1 to 20 carbon atoms. n represents an integer of 2 to 10.]

In Formulae (CO)-A-1 to (CO)-A-7, $R^1$ to $R^8$ each independently represent a hydrogen atom or a hydrocarbon group having 1 to 20 carbon atoms.

As the hydrocarbon group having 1 to 20 carbon atoms in $R^1$ to $R^8$, an alkyl group or an aryl group is preferable.

As the alkyl group in $R^1$ to $R^8$, a linear or branched alkyl group is preferable and an alkyl group having 1 to 10 carbon atoms is preferable, and specific examples thereof include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

As the alkyl group in $R^1$ to $R^8$, a linear alkyl group having 1 to 5 carbon atoms is more preferable and a methyl group or an ethyl group is still more preferable.

In the present embodiment, two or more of $R^1$ to $R^8$ may be bonded to each other and form a ring.

Examples of the aryl group as $R^1$ to $R^8$ include an aryl group in an arylalkyl group such as a benzyl group, a phenethyl group, a 1-naphthylmethyl group, a 2-naphthylmethyl group, a 1-naphthylethyl group, or a 2-naphthylethyl group.

In Formula (CO)-A-7, n represents an integer of 2 to 10.

In the present embodiment, as the constituent unit (CO)-A, a constituent unit derived from a compound represented by any of Formulae (CO)-A-1 to (CO)-A-3 is preferable, a constituent unit derived from a compound represented by Formula (CO)-A-1 or (CO)-A-3 is more preferable, and a constituent unit derived from a compound represented by Formula (CO)-A-3 is particularly preferable.

In the present embodiment, the constituent unit (CO)-A may be used alone or in combination of two or more kinds thereof.

The proportion of the constituent unit (CO)-A in the component (A) is preferably in a range of 1% by mole to 50% by mole, more preferably in a range of 10% by mole to 40% by mole, and still more preferably in a range of 15% by mole to 30% by mole with respect to all constituent units constituting the component (A). When the proportion of the constituent unit (CO)-A is greater than or equal to the lower limit of the above-described range, it is possible to improve etching resistance of the layer formed using the composition for nanoimprint. Further, when the proportion of the constituent unit (CO)-A is less than or equal to the upper limit of the above-described range, it is possible to provide moderate flexibility for the layer formed using the composition for nanoimprint.

Constituent Unit (CO)-B

The constituent (CO)-B is a constituent unit derived from a diene compound, and a constituent unit derived from a compound represented by any of the following Formulae (CO)-B-1 to (CO)-B-5 is preferable as the constituent unit (CO)-B.

(CO)-B-1

(CO)-B-2

(CO)-B-3

(CO)-B-4

(CO)-B-5

[In Formulae (CO)-B-1 to (CO)-B-5, $R^9$ to $R^{15}$ each independently represent a hydrogen atom, an alkyl group, an aryl group, or an alkenyl group. In this case, in Formula (CO)-B-1, at least one of $R^9$ to $R^{14}$ represents an alkenyl group having 3 to 15 carbon atoms. n and l reach independently represent an integer of 0 to 10. Here, a case where both of n and l represent 0 is excluded.]

In Formulae (CO)-B-1 to (CO)-B-5, $R^9$ to $R^{15}$ each independently represent a hydrogen atom, an alkyl group, an aryl group, or an alkenyl group. In Formulae (CO)-B-1 to (CO)-B-5, it is preferable that $R^9$ to $R^{15}$ each independently represent a hydrogen atom, an alkyl group having 1 to 10 carbon atoms, an aryl group having 6 to 14 carbon atoms, or an alkenyl group having 3 to 15 carbon atoms.

The definition of the alkyl group as $R^9$ to $R^{15}$ is the same as that for the alkyl group as $R^1$ to $R^8$ described above.

The definition of the aryl group as $R^9$ to $R^{15}$ is the same as that for the aryl group as $R^1$ to $R^8$ described above.

The alkenyl group as $R^9$ to $R^{15}$ in Formula (CO)-B-1 may be linear or branched, and the number of carbon atoms thereof is preferably in a range of 3 to 10, more preferably in a range of 2 to 5, still more preferably in a range of 2 to 4, and particularly preferably 3. Examples of the linear alkenyl group include a vinyl group, a propenyl group (allyl group), and a butynyl group. Examples of the branched alkenyl group include a 1-methylpropenyl group and a 2-methylpropenyl group.

Examples of respective compounds represented by Formulae (CO)-B-1 to (CO)-B-5 include cyclodiene such as 2,5-norbornadiene, 5-vinyl-2-norbornene, 5-ethylidene-2-norbornene, 5-methylene-2-norbornene, dicyclopentadiene, 5-isopropylidene-2-norbornene, tricyclopentadiene, 1,4,5,8-dimethano-1,4,4a,5,8,8a-hexahydronaphthalene, cyclopentadiene, 1,4-cyclohexadiene, 1,3-cyclohexadiene, 1,5-cyclooctadiene, 1-vinylcyclohexene, 2-vinylcyclohexene, or 3-vinylcyclohexene; and alkyl tetrahydroindene such as 4,5,7,8-tetrahydroindene, 4-methyltetrahydroindene, 6-methyltetrahydroindene, or 6-ethyltetrahydroindene.

In the present embodiment, the constituent unit (CO)-B may be used alone or in combination of two or more kinds thereof.

The proportion of the constituent unit (CO)-B in the component (A) is preferably in a range of 1% by mole to 50% by mole, more preferably in a range of 10% by mole to 40% by mole, and still more preferably in a range of 15% by mole to 30% by mole with respect to all constituent units constituting the component (A). When the proportion of the constituent unit (CO)-B is greater than or equal to the lower limit of the above-described range, it is possible to improve etching resistance of the layer formed using the composition for nanoimprint. Further, when the proportion of the constituent unit (CO)-B is less than or equal to the upper limit of the above-described range, it is possible to provide moderate flexibility for the layer formed using the composition for nanoimprint.

[Constituent Unit having Acyclic Olefin Structure]

It is preferable that the constituent unit having an acyclic olefin structure (hereinafter, also referred to as a "constituent unit (O)") is a constituent unit derived from an acyclic monoolefin, for example, an alpha olefin having 2 to 20 carbon atoms, particularly, ethylene or propylene. Further, the constituent unit having an acyclic olefin structure may be a constituent unit derived from an acyclic diene such as 1,5-hexadiene, 1,4-hexadiene, 1,3-hexadiene, 1,9-decadiene, butadiene, or isoprene.

As the constituent unit (O), a constituent unit derived from a compound represented by the following Formula (O)-1 is preferable.

(O)-1

[In Formula (O)-1, $R^{21}$ to $R^{24}$ each independently represent a hydrogen atom, an alkyl group, an aryl group, or an alkenyl group.]

In Formula (O)-1, $R^{21}$ to $R^{24}$ each independently represent a hydrogen atom, an alkyl group, an aryl group, or an alkenyl group.

The definitions of the alkyl group, the aryl group, and the alkenyl group as $R^{21}$ to $R^{24}$ are the same as those for the alkyl group, the aryl group, and the alkenyl group as $R^9$ to $R^{15}$ described above.

In the present embodiment, the constituent unit (O) may be used alone or in combination of two or more kinds thereof.

The proportion of the constituent unit (O) in the component (A) is preferably in a range of 20% by mole to 90% by mole, more preferably in a range of 20% by mole to 85% by mole, and still more preferably in a range of 25% by mole to 80% by mole with respect to all constituent units constituting the component (A). When the proportion of the constituent unit (O) is greater than or equal to the lower limit of the above-described range, it is possible to improve etching resistance of the layer formed using the composition for nanoimprint. Further, when the proportion of the constituent unit (O) is less than or equal to the upper limit of the above-described range, it is possible to provide moderate flexibility for the layer formed using the composition for nanoimprint.

The component (A) can be obtained by polymerizing a monomer that guides each constituent unit through known radical polymerization or the like using a radical polymerization initiator such as azobisisobutyronitrile (AIBN) or dimethyl azobisisobutyrate.

In the present embodiment, the weight average molecular weight (Mw) of the component (A) (in terms of polystyrene using gel permeation chromatography) is not particularly limited, but is preferably in a range of 1000 to 50000, more preferably in a range of 1500 to 30000, and most preferably in a range of 2000 to 20000. When the Mw thereof is less than or equal to the upper limit of the above-described range, it is possible to provide moderate flexibility for the layer formed using the composition for nanoimprint. When the Mw thereof is greater than or equal to the lower limit of the above-described range, the etching resistance is excellent.

In the present embodiment, the component (A) may be used alone or in combination of two or more kinds thereof.

In the present embodiment, the content of the component (A) may be suitably adjusted according to a pattern forming layer which is expected to be formed.

Polymerizable Monomer

The polymerizable monomer (hereinafter, also referred to as a "component (B)") used in the present embodiment will be described. In the present embodiment, the component (B) is a compound having a double bond for a radical copolymerization, and a monofunctional monomer or a polyfunctional monomer can be used.

In the present specification, the term "polyfunctional" means that two or more functional groups are included. The polyfunctional monomer may be bifunctional, trifunctional, tetrafunctional, or may have more functional groups. Examples of polyfunctional acrylate include diacrylate, triacrylate, and tetraacrylate. Further, examples of polyfunctional methacrylate include dimethacrylate, trimethacrylate, and tetramethacrylate.

Monofunctional Monomer

Examples of the monofunctional monomer include acrylate ester, acrylic acid ester, an acrylic acid monomer, N-acryloylamine, N-acryloylmorpholine, aliphatic monoacrylate, aliphatic monomethacrylate, alkoxylated lauryl acrylate, alkoxylated phenol acrylate, alkoxylated tetrahydrofurfuryl acrylate, alkyl methacrylate having 12 to 14 carbon atoms, an aromatic acrylate monomer, an aromatic mathacrylate monomer, benzyl methacrylate, caprolactone acrylate, cyclic trimethylolpropane formal acrylate, an alicyclic acrylate monomer, dicyclopentadienyl methacrylate, diethylene glycol methyl ether methacrylate, epoxy acrylate, epoxy methacrylate, 2(2-ethoxy-ethoxy)ethyl acrylate, ethoxylated (4) nonyl phenol acrylate, ethoxylated (4) nonyl phenol methacrylate, ethoxylated nonyl phenol acrylate, 2-ethylhexyl methacrylate, isobornyl acrylate, isobornyl methacrylate, isodecyl acrylate, isodecyl methacrylate, isooctyl acrylate, isooctyl methacrylate, lauryl acrylate, lauryl methacrylate, methoxy polyethylene glycol (350) monoacrylate, methoxy polyethylene glycol (350) monomethacrylate, methoxy polyethylene glycol (550) monoacrylate, methoxy polyethylene glycol (550) monomethacrylate, nonyl phenyl polyoxy ethylene acrylate, octyl decyl acrylate, 2-phenoxy ethyl acrylate, 2-phenoxy ethyl methacrylate, polyester acrylate, polyester (meth)acrylate, polyether acrylate, polyether methacrylate, polyphenoxy acrylate, stearyl acrylate, stearyl methacrylate, tetrahydrofurfuryl acrylate, tetrahydrofurfuryl methacrylate, tridecyl acrylate, tridecyl methacrylate, triethylene glycol ethyl ether methacrylate, 3,3,5-trimethyl cyclohexyl methacrylate, urethane acrylate, urethane methacrylate, a urethane oligomer, an acrylated diol oligomer (for example, SARTOMER 2000 oligomer or unsaturated aliphatic ester which is polyol polyacrylate), an oligomer (for example, a polystyrene oligomer having a methacryloyl group at one terminal (Mn=6000, trade name: AS-6, manufactured by TOAGOSEI CO., LTD.)) in which a (meth)acryloyl group is bonded to one terminal of polymethyl (meth)acrylate, poly-n-butyl (meth)acrylate, poly-z-butyl (meth)acrylate, or polystyrene, a polymethyl methacrylate oligomer (Mn=6000, trade name: AA-6, manufactured by TOAGOSEI CO., LTD.) having a methacryloyl group at one terminal, a poly-n-butyl acrylate oligomer (Mn=6000, trade name: AB-6, manufactured by TOAGOSEI CO., LTD.) having a methacryloyl group at one terminal, a polyurethane acrylate oligomer, a polyurethane methacrylate oligomer, a polymethyl methacrylate oligomer whose one terminal is methacryloylated, a polystyrene oligomer whose one terminal is methacryloylated, polyethylene glycol whose one terminal is methacryloylated, polyester methacrylate, polyurethane methacrylate, polyol methacrylate, melamine methacrylate, ethoxylated trimethanolpropane methacrylate, ethoxylated di(trimethanolpropane)methacrylate, ethoxylated pentaerythritol methacrylate, ethoxylated dipentaerythritol methacrylate, ethoxylated neopentaglycol methacrylate, ethoxylated propylene glycol methacrylate, polyurethane acrylate, polyol acrylate, propylene glycol acrylate, alkane diol acrylate, trimethylolpropane acrylate, glycerol propoxy acrylate, pentaerythritol acrylate, neopentaglycol acrylate, N-vinylamide, N-vinyl-formamide, and N-vinyl-pyrrolidone, and combinations of these. Moreover, a monomer or an oligomer of acrylate or methacrylate or a combination of these may be exemplified.

Bifunctional Monomer

Examples of the bifunctional monomer include alkoxylated aliphatic diacrylate, alkoxylated aliphatic dimethacrylate, alkoxylated neopentyl glycol diacrylate, alkoxylated neopentyl glycol dimethacrylate, 1,4-butanediol diacrylate, 1,4-butanediol dimethacrylate, 1,3-buthylene glycol diacrylate, 1,3-buthylene glycol dimethacrylate, cyclohexane dimethanol diacrylate, cyclohexane dimethanol dimethacrylate, diethylene glycol diacrylate, diethylene glycol dimethacrylate, dipropylene glycol diacrylate, dipropylene glycol dimethacrylate, 1,12-dodecanediol dimethacrylate, ethoxylated bisphenol A dimethacrylate, ethoxylated (2) bisphenol A dimethacrylate, ethoxylated (3) bisphenol A diacrylate, ethoxylated (4) bisphenol A diacrylate, ethoxylated (4) bisphenol A dimethacrylate, ethoxylated (6) bisphenol A dimethacrylate, ethoxylated (8) bisphenol A dimethacrylate, ethoxylated (10) bisphenol A diacrylate, ethoxylated (10) bisphenol A dimethacrylate, ethoxylated (30) bisphenol A diacrylate, ethoxylated (30) bisphenol A dimethacrylate, ethylene glycol dimethacrylate, 1,6-hexanediol diacrylate, 1,6-hexanediol dimethacrylate, neopentyl glycol diacrylate, neopentyl glycol dimethacrylate, polyester diacrylate, polyethylene glycol (200) diacrylate, polyethylene glycol (400) diacrylate, polyethylene glycol (400) dimethacrylate, polyethylene glycol (600) diacrylate, polyethylene glycol (600) dimethacrylate, polyethylene glycol dimethacrylate, polypropylene glycol (400) dimethacrylate, propoxylated neopentyl glycol diacrylate, propoxylated neopentyl glycol dimethacrylate, propoxylated (2) neopentyl glycol diacrylate, tetraethylene glycol diacrylate, tetraethylene glycol dimethacrylate, tricyclodecane dimethanol diacrylate, triethylene glycol diacrylate, triethylene glycol dimethacrylate, tripropylene glycol diacrylate, and tripropylene glycol dimethacrylate, and combinations of these.

Trifunctional Monomer

Examples of the trifunctional monomer include ethoxylated (3) trimethylolpropane triacrylate, ethoxylated (3) trimethylolpropane trimethacrylate, ethoxylated (6) trimethylolpropane triacrylate, ethoxylated (9) trimethylolpropane triacrylate, ethoxylated (15) trimethylolpropane triacrylate, ethoxylated (20) trimethylolpropane triacrylate, pentaerythritol triacrylate, propoxylated (3) glyceryl triacrylate, propoxylated (5.5) glyceryl triacrylate, propoxylated (3) trimethylolpropane triarylate, propoxylated (6) trimethylolpropane triacrylate, trimethylolpropane triacrylate, trimethylolpropane trimethacrylate, tris-(2-hydroxyethyl)-isocyanurate triacrylate, and tris-(2-hydroxyethyl)-isocyanurate trimethacrylate, and combinations of these.

Tetrafunctional or Pentafunctional Monomer

Examples of the tetrafunctional or pentafunctional monomer or oligomer include di(trimethylolpropane)-tetraacrylate, ethoxylated (4) pentaerythritol tetraacrylate, dipentaerythritol pentaacrylate, pentaacrylate ester, and pentaerythritol tetraacrylate, and combinations of these.

Other Polyfunctional Monomers

In addition to the above-described polyfunctional monomers, hexafunctional monomers and the like can be suitably used within the range in which the effects of the present invention are exhibited.

Among the examples described above, bifunctional monomers are preferable as the polyfunctional monomers in the present embodiment. As the bifunctional monomers, bifunctional monomers having an aliphatic cyclic group are preferable, and preferred examples thereof include cyclohexane dimethanol diacrylate, cyclohexane dimethanol dimethacrylate, and tricyclodecane dimethanol diacrylate.

In the present embodiment, the above-described monofunctional monomers or polyfunctional monomers may be respectively used alone or in combination as the component (B).

In the present embodiment, it is more preferable that the polyfunctional monomers are used alone as the component (B).

In a case where the polyfunctional monomers and monofunctional monomers are used in combination as the component (B), the composition for nanoimprint can be prepared without using a solvent component described below.

In the present embodiment, the component (B) may be used alone or in combination of two or more kinds thereof.

In the present embodiment, the content of the component (B) in the composition for nanoimprint is preferably in a range of 0.5 parts by mass to 60 parts by mass, more preferably in a range of 1 part by mass to 50 parts by mass, and still more preferably in a range of 1 part by mass to 40 parts by mass with respect to 100 parts by mass of the component (A). When the content of the component (B) is in the above-described range, it is possible to sufficiently provide flexibility for transferring a pattern suitable for a mold at the time of pressing the mold.

Photoinitiator

The photoinitiator (hereinafter, also referred to as a component (C)) is not particularly limited as long as the photoinitiator is a compound that initiates and accelerates polymerization of the component (A) at the time of irradiation with light, and examples thereof include 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-1-hydroxy-2-methylpropan-1-one, 1-(4-dodecylphenyl)-2-hydroxy-2-methylpropan-1-one, 2,2-dimethoxy-1,2-diphenylethan-1-one, bis(4-dimethylaminophenyl)ketone, 2-methyl-1-(4-methylthiophenyl)-2-morpholinopropan-1-one, 2-benzyl-2-dimethylamino-1-(4-morpholinophenyl)-butane-1-one, ethanone-1-[9-ethyl-6-(2-methylbenzoyl)-9H-carbazole-3-yl]-1-(o-acetyloxime), 2,4,6-trimethylbenzoyl diphenyl phosphine oxide, 4-benzoyl-4'-methyl dimethyl sulfide, 4-dimethylamino benzoate, methyl 4-dimethylamino benzoate, ethyl 4-dimethylamino benzoate, butyl 4-dimethylamino benzoate, 4-dimethylamino-2-ethylhexyl benzoate, 4-dimethylamino-2-isoamyl benzoate, benzyl-β-methoxyethyl acetal, benzyl dimethyl ketal, 1-phenyl-1,2-propanedione-2-(o-ethoxycarbonyl)oxime, methyl o-benzoyl benzoate, 2,4-diethyl thioxanthone, 2-chlorothioxanthone, 2,4-dimethyl thioxanthone, 1-chloro-4-propoxy thioxanthone, thioxanthene, 2-chlorothioxanthene, 2,4-diethyl thioxanthene, 2-methyl thioxanthene, 2-isopropyl thioxanthene, 2-ethyl anthraquinone, octamethyl anthraquinone, 1,2-benzanthraquinone, 2,3-diphenyl anthraquinone, azobisisobutyronitrile, benzoyl peroxide, cumene peroxide, 2-mercaptobenzimidazole, 2-mercaptobenzoxazole, 2-mercaptobenzothiazole, 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxy benzophenone, benzoyl, benzoin, benzoin methyl ether, benzoin ethyl ether, benzoin isopropyl ether, benzoin-n-butyl ether, benzoin isobutyl ether, benzoin butyl ether, acetophenone, 2,2-diethoxy acetophenone, p-dimethyl acetophenone, p-dimethylaminopropiophenone, dichloroacetophenone, trichloroacetophenone, p-tert-butyl acetophenone, p-dimethylaminoacetophenone, p-tert-butyltrichloroacetophenone, p-tert-butyldichloroacetophenone, α,α-dichloro-4-phenoxyacetophenone, thioxanthone, 2-methyl thioxanthone, 2-isopropyl thioxanthone, dibenzosuberone, pentyl-4-dimethylaminobenzoate, 9-phenyl acridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazone, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine; ketone peroxides such as methyl ethyl ketone peroxide, methyl isobutyl ketone peroxide, and cyclohexanone peroxide; diacyl peroxides such as isobutyryl peroxide and bis(3,5,5-trimethylhexanoyl)peroxide; hydroperoxides such as p-menthane hydroperoxide and 1,1,3,3-tetramethyl butyl hydroperoxide; dialkyl peroxides such as 2,5-dimethyl-2,5-bis(t-butylperoxy)hexane; peroxyketals such as 1,1-bis(t-butylperoxy)-3,3,5-trimethylcyclohexane; peroxyesters such as t-butyl peroxyneodecanoate and 1,1,3,3-tetramethyl peroxyneodecanoate; peroxycarbonates such as di-n-propyl peroxydicarbonate and diisopropyl peroxydicarbonate; and azo compounds such as azobisisobutyronitrile, 2,2'-azobis(2,4-dimethylvaleronitrile), and 2,2'-azobisisobutyrate.

Among these, 2-methyl-1-(4-methylthiophenyl)-2-morpholinopropan-1-one, 2,2-dimethoxy-1,2-diphenylethan-1-one, 1-[4-(2-hydroxyethoxy)-phenyl]-2-hydroxy-2-methyl-1-propan-1-one, 1-hydroxy-cyclohexyl-phenyl-ketone, 2-hydroxy-2-methyl-1-phenyl-propan-1-one, iodonium, (4-methylphenyl)[4-(2-methylpropyl)phenyl]-hexafluorophosphate, a mixture of 2-[2-oxo-2-phenylacetoxyethoxy] ethyl ester and 2-(2-hydroxyethoxy)ethyl ester, phenyl glycosylate, and benzophenone are preferable.

Commercially available products can be used for these photoinitiators. These photoinitiators may be used alone or in combination of two or more kinds thereof.

The content of the component (C) in the composition for nanoimprint is preferably in a range of 0.1 parts by mass to 10 parts by mass, more preferably in a range of 0.1 parts by mass to 5 parts by mass, and still more preferably in a range of 0.1 parts by mass to 1 part by mass with respect to 100 parts by mass of the component (A) included in the composition for nanoimprint. When the content thereof is set to be in the above-described range, photocurability becomes excellent.

Solvent

In a case where the composition for nanoimprint of the present embodiment contains a solvent (hereinafter, also referred to as a "component (D)"), from the viewpoint of particularly excellent coating properties, alcohols are preferable as the component (D).

Specific examples thereof include halogenated hydrocarbon such as methyl chloride, dichloromethane, chloroform, ethyl chloride, dichloroethane, n-propyl chloride, n-butyl chloride, or chlorobenzene; alkylbenzenes such as benzene, toluene, xylene, ethylbenzene, propylbenzene, and butylbenzene; linear aliphatic hydrocarbons such as ethane, propane, butane, pentane, hexane, heptane, octane, nonane, and decane; branched aliphatic hydrocabons such as 2-methylpropane, 2-methylbutane, 2,3,3-trimethylpentane, and 2,2,5-trimethylhexane; cyclic aliphatic hydrocarbons such as cyclohexane, methylcyclohexane, ethylcyclohexane, and decahydroxynaphthalene; and paraffin oil in which a petroleum fraction is hydrogenation-refined.

These components (D) may be used alone or in combination of two or more kinds thereof.

The amount of the component (D) to be used is not particularly limited and can be suitably set according to the thickness of a coating film at a concentration which can be applied to a substrate or the like. The solid content concentration of the composition for nanoimprint is typically in a range of 1% by mass to 20% by mass and preferably in a range of 2% by mass to 15% by mass.

According to the composition for nanoimprint of the present invention, it is possible to form a pattern forming layer in which high etching resistance and flexibility that allows an uneven pattern of a mold to be transferred are both achieved. The reason for this is assumed as follows.

The composition for nanoimprint of the present invention contains a cycloolefin-based copolymer and a polymerizable monomer. It is considered that a constituent unit having a cyclic olefin included in the cycloolefin-based copolymer contributes to improvement of the etching resistance. Further, in a case where the cycloolefin-based copolymer has a constituent unit of an acyclic olefin, it is considered that the constituent unit of an acyclic olefin contributes to provision of the flexibility.

Moreover, when the composition for nanoimprint contains a polymerizable monomer, it is considered that this contributes to provision of sufficient flexibility for reliably transferring a pattern shape of a mold.

In the related art, in regard to pattern formation using the composition for nanoimprint, for example, Japanese Patent No. 5560049 describes that the flexibility and the etching resistance are both achieved by respectively forming a pattern forming layer which has flexibility for reliably transferring a pattern shape of a mold and a pattern forming layer which has etching resistance.

Meanwhile, according to the composition for nanoimprint of the present invention, it is possible to form a pattern forming layer in which the flexibility that allows an uneven pattern of a mold to be transferred and high etching resistance are both achieved even in a case of a single layer.

Cured Product

A second aspect of the present invention is a cured product formed by curing the composition for nanoimprint according to the first aspect of the present invention.

The cured product formed by curing the composition for nanoimprint according to the first aspect of the present invention is excellent in pattern precision, curability, chemical resistance, a low dielectric constant, and transparency. Particularly, the cured product can be suitably used as a protective film of a liquid crystal color filter, a spacer, or a member for a liquid crystal display.

The cured product of the present invention can be obtained by a pattern forming method according to a third aspect of the present invention described below.

Pattern Forming Method

The third aspect of the present invention is a pattern forming method including process 1 of coating a substrate with the composition for nanoimprint according to the first aspect of the present invention described above to form a pattern forming layer; process 2 of pressing a mold, on which an uneven structure having a predetermined pattern is formed, to the pattern forming layer and deforming the pattern forming layer to the predetermined pattern; process 3 of exposing the pattern forming layer to light in a state where the mold is pressed; and process 4 of peeling the mold pressed to the pattern forming layer.

First Embodiment

FIGS. 1A to 1D are process views illustrating the pattern forming method according to a first embodiment of the present invention.

Process 1

Figure 1A:
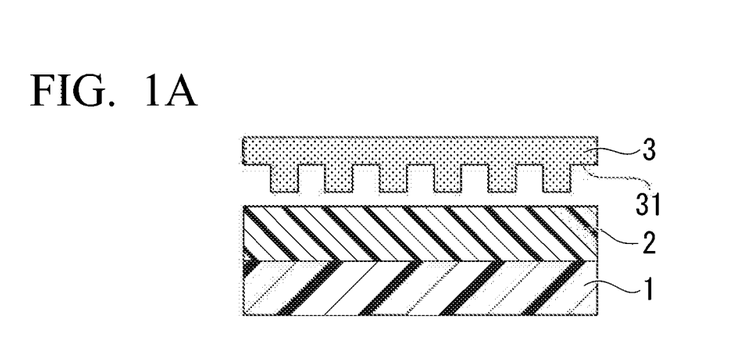
FIG. 1A is a process view schematically describing an example of a pattern forming method according to the present embodiment.

First, as illustrated in FIG. 1A, a substrate 1 is coated with the above-described composition for nanoimprint according to the first aspect of the present invention to form a pattern forming layer 2.

The substrate 1 can be selected depending on various applications, and examples of the substrate 1 include quartz, sapphire, glass, an optical film, a ceramic material, a vapor-deposition film, a magnetic film, a reflective film, a metal substrate such as Ni, Cu, Cr, or Fe, paper, spin on glass (SOG), a polymer substrate such as a polyester film, a polycarbonate film, or a polyimide film, a TFT array substrate, an electrode plate of PDP, glass, a transparent plastic substrate, conductive base materials such as ITO or metals, and a semiconductor fabrication substrate such as an insulating base material, silicone, silicone nitride, polysilicone, silicone oxide, or amorphous silicone. Moreover, the shape of the substrate is not particularly limited, and the substrate may have a shape of a plate or a roll. In addition, as described below, a light-transmissive or non-transmissive substrate can be selected as the substrate according to a combination of the substrate with a mold.

Examples of the method of coating a substrate with the composition for nanoimprint include a spin coating method, a spray method, a roll coating method, and a rotary coating method. Since the pattern forming layer 2 functions as a mask in a process of etching the substrate 1 which is subsequently performed, it is preferable that the thickness of the pattern forming layer 2 when applied to the substrate 1 is uniform. Accordingly, the spin coating method is suitable for coating the substrate 1 with the composition for nanoimprint.

In addition, the film thickness of the pattern forming layer 2 may be suitably selected according to the applications and may be in a range of 0.05 μm to 30 μm.

Process 2

Process 2 is a process of pressing a mold, on which an uneven structure having a predetermined pattern is formed, to the pattern forming layer and deforming the pattern forming layer to the predetermined pattern.

Figure 1B:
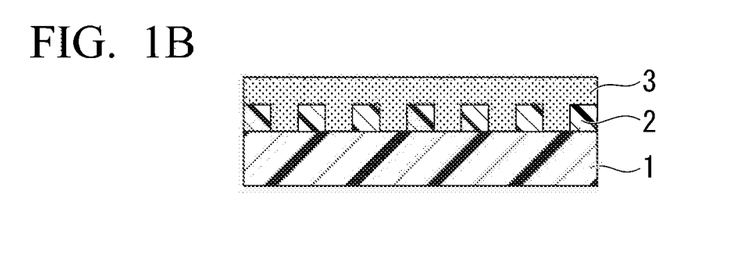
FIG. 1B is a process view schematically describing an example of a pattern forming method according to the present embodiment.

As illustrated in FIG. 1B, in the substrate 1 on which the pattern forming layer 2 is laminated, a mold 3 on which the predetermined pattern having an uneven structure is formed is pressed against the pattern forming layer 2, and the pattern forming layer 2 is deformed according to the pattern with the uneven structure of the mold 3. The pressure at the time when the mold 3 is pressed against the pattern forming layer 2 is preferably 10 MPa or less, more preferably 5 MPa or less, and particularly preferably 1 MPa or less.

When the mold 3 is pressed against the pattern forming layer 2, the composition for nanoimprint positioned on projections of the mold 3 are easily pressed into recesses of the mold 3, and the uneven structure of the mold 3 is transferred to the pattern forming layer 2.

As the mold which can be used in the present invention, a mold having a pattern to be transferred is used. The pattern on the mold can be formed according to desired processing precision using a photolithographic method or an electron beam lithographic method, but the mold pattern forming method of the present invention is not particularly limited.

A light-transmissive mold is preferable as the mold used in the present invention. The material of the light-transmissive mold is not particularly limited, but a material having predetermined strength and durability may be used. Specific examples thereof include glass, quartz, a light-transmissive resin film such as PMMA, or a polycarbonate resin, a transparent metal deposition film, a flexible film such as polydimethylsiloxane, a photocurable film, and a metal film.

Process 3

Process 3 is a process of exposing the pattern forming layer to light in a state where the mold is pressed.

Figure 1C:
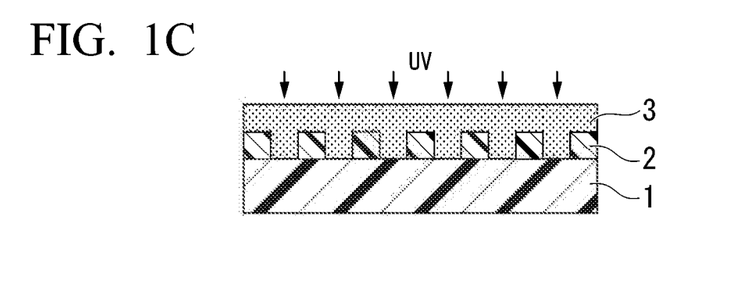
FIG. 1C is a process view schematically describing an example of a pattern forming method according to the present embodiment.

As illustrated in FIG. 1C, the pattern forming layer 2 is exposed to light in the state in which the mold 3 is pressed. Specifically, the pattern forming layer 2 is irradiated with electromagnetic waves such as ultraviolet (UV) rays (indicated by arrows in the figure). Due to the exposure, the pattern forming layer is cured in the state in which the mold 3 is pressed, and the pattern forming layer 2 to which the uneven structure of the mold 3 is transferred is formed. Moreover, the mold 3 has permeability to the electromagnetic waves applied to the pattern forming layer.

In the present invention, the light used to cure the pattern forming layer is not particularly limited, and examples thereof include high-energy ionizing radiation and light or radiation having a wavelength in a near ultraviolet region, a far ultraviolet region, a visible region, or an infrared region.

As sources of high-energy ionizing radiation, electron beams accelerated by an accelerator such as a Cockcroft type accelerator, a Van der Graaf type accelerator, a linear accelerator, a betatron, or a cyclotron are most industrially used conveniently and economically, and other examples thereof include radiation such as $\gamma$-rays, X-rays, $\alpha$-rays, neutron beams, or proton beams radiated from a radioisotope or a nuclear reactor. Examples of sources of ultraviolet rays include an ultraviolet fluorescent lamp, a low pressure mercury lamp, a high pressure mercury lamp, an ultrahigh mercury lamp, a xenon lamp, a carbon arc lamp, and a sun lamp.

Examples of the radiation include microwave and EUV. In addition, laser light used for microfabrication of a semiconductor, for example, an LED, semiconductor laser light, KrF excimer laser light having a wavelength of 248 nm, or ArF excimer laser having a wavelength of 193 nm is preferably used in the present invention. As such light, monochromatic light may be used or light (mixed light) having a plurality of wavelengths different from each other may be used.

Process 4

Figure 1D:
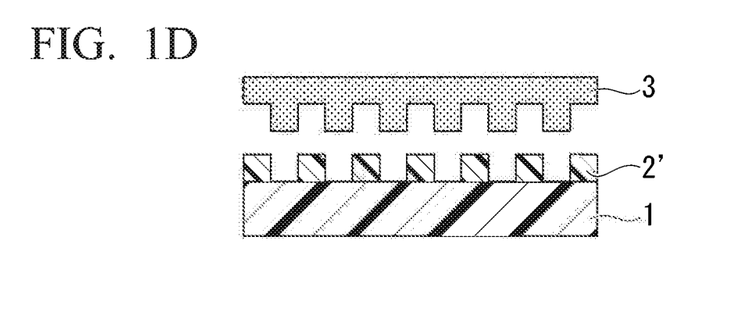
FIG. 1D is a process view schematically describing an example of a pattern forming method according to the present embodiment.

In process 4, the mold pressed to the pattern forming layer is peeled off. As illustrated in FIG. 1D, the mold 3 is peeled off from the substrate 1 and the pattern forming layer 2. In this manner, a pattern 2' in a cured state is patterned on the substrate 1.

In the present embodiment, a release layer may be formed by further coating a surface 31 of the mold 3 with a release agent. Here, examples of the release agent applied to the surface of the mold include a silicon-based release agent, a fluorine-based release agent, a polyethylene-based release agent, a polypropylene-based release agent, a paraffin-based release agent, a montan-based release agent, and a carnauba-based release agent. For example, a commercially available coating type release agent such as OPTOOL DSX (manufactured by DAIKIN INDUSTRIES, Ltd.) can be suitably used.

Further, the release agent may be used alone or in combination of two or more kinds thereof. Among the above-described examples, a fluorine-based release agent is particularly preferable.

Second Embodiment

A second embodiment of a pattern forming method of the present invention will be described.

The second embodiment includes the processes 1 to 4 which are the same as those of the first embodiment described above and process 1' of softening the pattern forming layer formed by process 1 after process 1 and before process 2.

Process 1'

Process 1' is a process of softening the pattern forming layer formed by process 1 and is carried out in order to soften the pattern forming layer so that the pattern of the uneven structure of the mold 3 can be easily transferred. During process 1', more specifically, heating is performed in a temperature range of 80° C. to 120° C. for 60 seconds to 100 seconds.

Third Embodiment

A third embodiment of a pattern forming method of the present invention will be described.

FIGS. 2A to 2F are process views illustrating the third embodiment of the pattern forming method of the present invention.

The third embodiment includes the processes 1 to 4 which are the same as those of the first embodiment described above and further includes etching process 5 and pattern removal process 6 after the etching process.

Process 5

Process 5 is a process of etching the substrate using the pattern formed by the processes 1 to 4 as a sacrificial film.

Figure 2A:
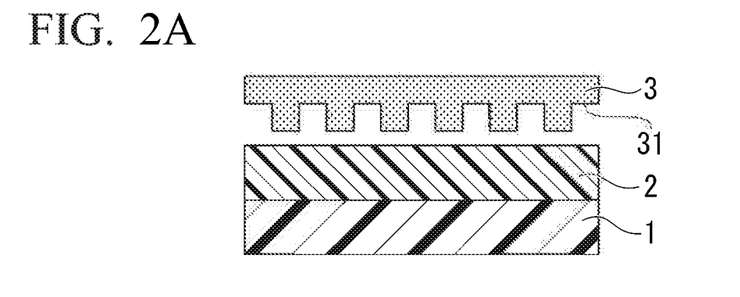
FIG. 2A is a process view schematically describing an example of a pattern forming method according to the present embodiment.
Figure 2B:
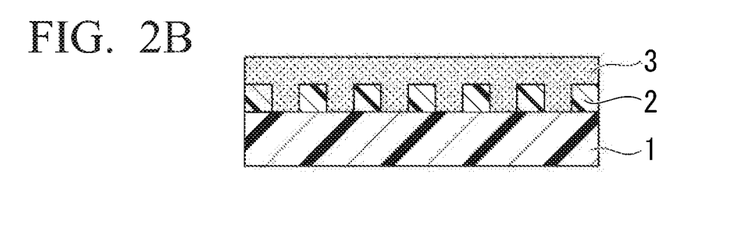
FIG. 2B is a process view schematically describing an example of a pattern forming method according to the present embodiment.
Figure 2C:
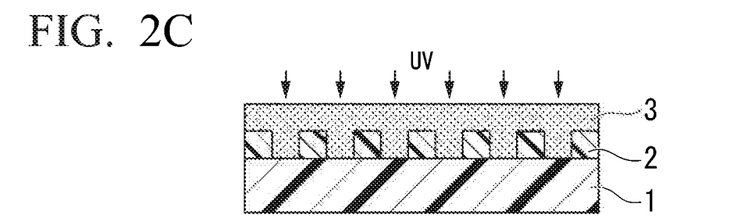
FIG. 2C is a process view schematically describing an example of a pattern forming method according to the present embodiment.
Figure 2D:
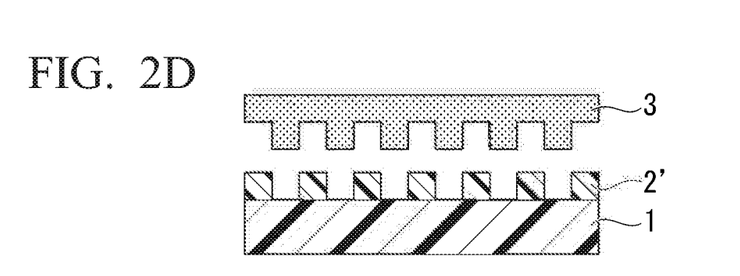
FIG. 2D is a process view schematically describing an example of a pattern forming method according to the present embodiment.
Figure 2E:
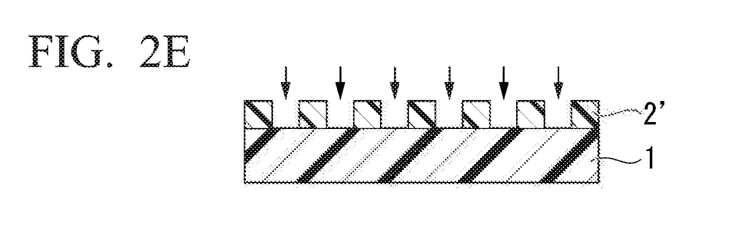
FIG. 2E is a process view views schematically describing an example of a pattern forming method according to the present embodiment.

As illustrated in FIG. 2E, during process 5, the substrate 1 exposed to the opening portions (portions formed by projections of the mold 3 being brought into contact with the pattern forming layer 2) of the pattern forming layer 2 is etched to a predetermined depth for removal by irradiating the substrate 1 on which the patterned pattern forming layer 2 is formed with plasma and/or reactive ions (indicated by arrows in the figure).

Gas of plasma and/or reactive ions to be used in the etching process is not particularly limited as long as the gas is typically used in the dry etching field. Using the composition for nanoimprint which is employed together with the substrate, suitable gas can be appropriately selected. In a case where the pattern formed using the composition for nanoimprint according to the present invention is used as an etching mask, it is preferable to select chlorine-based plasma and/or chlorine-reactive ions.

Process 6

Figure 2F:
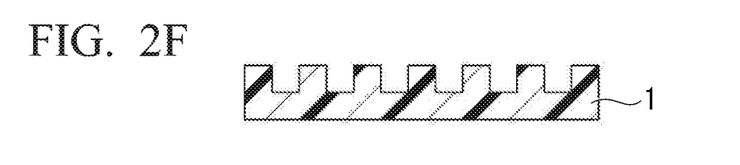
FIG. 2F is a process view schematically describing an example of a pattern forming method according to the present embodiment.

As illustrated in FIG. 2F, process 6 is a process of removing the pattern forming layer 2 present on the substrate 1 after the substrate 1 is etched.

The method of removing the pattern forming layer 2, which becomes unnecessary from the substrate 1, is not particularly limited, and a treatment of cleaning the substrate 1 using a solution that can dissolve the pattern forming layer 2 is exemplified.

Fourth Embodiment

A fourth embodiment of a pattern forming method of the present invention will be described.

The fourth embodiment includes process 1, process 1', processes 2 to 4 which are the same as those of the second embodiment described above and further includes process 5 which is the same as that of the third embodiment and process 6.

According to the pattern forming method of the present invention, it is possible to form a pattern forming layer in which etching resistance and flexibility that allows an uneven pattern of a mold to be transferred are both achieved by means of using the composition for nanoimprint of the first aspect of the present invention. For this reason, the pattern of the mold can be reliably transferred to the substrate.

Article having Pattern

The fourth aspect of the present invention is an article having the pattern obtained by the pattern forming method according to the third aspect of the present invention.

As the article, specifically, an electronic component having the pattern obtained by the pattern forming method according to the third aspect of the present invention as an insulating member, a protection member, or an optical member is exemplified.

The pattern obtained by the pattern forming method according to the third aspect of the present invention can be used as an insulating member, a protection member, or an optical member included in an electronic component represented by a semiconductor element such as an LSI, a system LSI, a DRAM, an SDRAM, an RDRAM, or a D-RDRAM, or can be also used as a sacrificial film during when a semiconductor element is manufactured.

Examples of the electronic component using the pattern obtained by the pattern forming method according to the third aspect of the present invention include a display, a camera, and a medical instrument.

For example, a circuit structure can be formed on the substrate based on the pattern obtained by the pattern forming method of the third aspect to obtain a circuit substrate used for a semiconductor element or the like. In addition, the above-described electronic component can be formed by providing a control structure, which controls the circuit substrate, on the circuit substrate.

Meanwhile, in a case where a substrate provided with a circuit or an electronic component is prepared, finally, the pattern may be removed from the processed substrate, but may remain as a member constituting an element.

EXAMPLES

Hereinafter, the present invention will be described in more detail with reference to examples, but the present invention is not limited to the following examples.

Example 1

Preparation of Composition 1 for Nanoimprint

In Example 1, a polymer compound represented by the following Chemical Formula (A)-1 was used as a cycloolefin-based copolymer.

Tricyclodecane dimethanol diacrylate was used as a polymerizable monomer.

A compound represented by the following Chemical Formula (C)-1 was used as a photoinitiator.

100 parts by mass of the polymer compound (Mw: approximately 100000) represented by the following Chemical Formula (A)-1, 20 parts by mass of tricyclodecane dimethanol diacrylate, 1 part by mass of the compound represented by the following Chemical Formula (C)-1, and a solvent (decahydroxynaphthalene) were mixed with each other, thereby preparing a composition 1 for nanoimprint (solid content concentration: 3% by mass).

Formation (1) of Nanoimprint Pattern

Process 1

A silicon substrate was coated with the composition 1 for nanoimprint using a spinner and a pattern forming layer having a film thickness of approximately 200 nm was formed.

Thereafter, the pattern forming layer was baked at 70° C. for 90 seconds.

Process 1'

The baked pattern forming layer was heated at 100° C. for 80 seconds.

Process 2

Subsequently, a glass mold (having recesses with respect to the composition film for nanoimprint) warmed to 90° C. was pressed against the pattern forming layer obtained in the [process 1'] described above at a press pressure of 2 MPa for 300 seconds using a nanoimprinter ST200 (manufactured by TOSHIBA MACHINE CO., LTD.).

Process 3

Next, the glass mold and the pattern forming layer were exposed to light for 30 seconds using i-LineLED belonging to ST200 in the state in which the mold was pressed against the pattern forming layer.

Process 4

Subsequently, the mold pressed against the pattern forming layer was peeled off. In this manner, a nanoimprint pattern in a line and space shape having a line width of 1000 nm and a pitch width of 3000 nm was formed on the silicon substrate. At this time, the pattern forming layer positioned on projections of the mold was easily pressed into recesses of the mold and the uneven pattern of the mold was reliably transferred to the pattern forming layer without the pattern forming layer remaining on the projections of the mold as a residue.

Process 5

The silicon substrate on which a line and space pattern was formed was subjected to a $BCl_3$ plasma etching treatment under the following treatment conditions.

Treatment Conditions

Plasma etching apparatus: trade name: TCA-3822, manufactured by TOKYO OHKA KOGYO CO., LTD.

Plasma etching using $BCl_3$ gas (pressure of 0.5 Pa for 630 seconds)

Power: 600

Bias: 100 W

Temperature of substrate: 10° C.

Evaluation of Etching Resistance

The film reduction amount of the nanoimprint pattern in the above-described "process 4" was measured and calculated as an etching rate (thickness of the etched film per unit time: unit nm/min) converted to the film reduction amount per minute. As a result, the value was 26.67 nm/min.

Comparative Example 1

Preparation of Resin Composition 2

A resin composition 2 was obtained by carrying out the process in the same manner as in Example 1 except that a cresol novolac resin obtained by the following Synthesis Example 1 was used in place of the cycloolefin copolymer and the solvent was changed into propylene glycol monomethyl ether and diethylene glycol methyl ethyl ether (solvent in which propylene glycol monomethyl ether and diethylene glycol methyl ethyl ether were mixed at a mass ratio of 1:1).

Synthesis Example 1 m-cresol and p-cresol were used at a ratio of 6:4, formaldehyde and oxalic acid having a catalyst amount were added thereto so that the mixture was reacted under reflux, and the reaction time was adjusted, thereby obtaining a novolac resin having a mass average molecular weight of 5000 in terms of polystyrene.

Formation of a nanoimprint pattern was performed in the same manner as in "formation (1) of nanoimprint pattern" of Example 1 described above using the resin composition 2, but the pressing of the mold in process 2 described above was not able to be performed and thus the nanoimprint pattern was not able to be obtained.

Comparative Example 2

Preparation of Composition 3 for Nanoimprint 5 parts by mass of a polymer compound (Mw: approximately 2000) represented by the following Chemical Formula (A)-2, 95 parts by mass of tetraethoxysilane, and 1 part by mass of the compound represented by Chemical Formula (C)-1 were mixed with each other, thereby obtaining a composition 3 for nanoimprint.

(A)-2

Formation (2) of Nanoimprint Pattern

Process A

A silicon substrate was coated with the resin composition 2 using a spinner and an organic composition film (underlayer film) having a film thickness of approximately 200 nm was formed. Thereafter, the organic composition film was coated with the composition 3 for nanoimprint using a spinner and a pattern forming layer having a film thickness of approximately 50 nm was formed.

Process B

A glass mold (having recesses with respect to the pattern forming layer) was pressed against the pattern forming layer at room temperature (25° C.) and at a press pressure of 1 MPa for 50 seconds using a nanoimprinter ST200 (manufactured by TOSHIBA MACHINE CO., LTD.).

Process C

Next, the mold and the pattern forming layer were exposed to light for 30 seconds using i-LineLED belonging to ST200 in the state in which the mold was pressed against the pattern forming layer, and the mold was peeled off. In this manner, a nanoimprint pattern in a line and space shape having a line width of 1000 nm and a pitch width of 3000 nm was formed on the silicon substrate.

Process D

The obtained pattern was subjected to an oxygen plasma etching treatment under the following treatment conditions.

Plasma etching apparatus: (trade name: TCA-3822, manufactured by TOKYO OHKA KOGYO CO., LTD.)

Plasma etching using $O_2$ gas (pressure: 40 Pa, RF: 800 W, temperature: 100° C., treatment time: 30 seconds, frequency: 13.56 MHz)

As a result of the oxygen plasma etching, the pattern of the composition 3 for nanoimprint was used as a mask, and the organic composition film was etched, thereby forming a pattern in a line and space shape of the organic composition film (resin composition 2) having a line width of approximately 1000 nm and a pitch width of approximately 3000 nm on the silicon substrate.

Process E

The silicon substrate on which the line and space pattern of the resin composition 2 was formed was subjected to a $BCl_3$ plasma etching treatment under the following treatment conditions.

Plasma etching apparatus: trade name: TCA-3822, manufactured by TOKYO OHKA KOGYO CO., LTD.

Plasma etching using $BCl_3$ gas (pressure of 0.5 Pa for 630 seconds)

Power: 600

Bias: 100 W

Temperature of substrate: 10° C.

Evaluation of Etching Resistance

The film reduction amount of the pattern of the resin composition 2 in the above-described "process E" was measured and calculated as an etching rate (thickness of the etched film per unit time: unit nm/min) converted to the film reduction amount per minute. As a result, the value was 24.76 nm/min.

As shown in the above-described results, it was confirmed that the composition for nanoimprint of Example 1 had the same level of etching resistance as that of the resin composition of Comparative Example 1 in which the nanoimprint pattern was not able to be directly formed (the pressing of the mold was not able to be performed) even though the etching process required for the pattern transfer to the substrate was carried out once.

Since the composition for nanoimprint of the present invention is capable of forming a single-layered pattern forming layer directly on the substrate to be transferred, which is expected to be processed, the processing method of the substrate can be simplified and the pattern of the mold can be reliably transferred.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: substrate
2: pattern forming layer
3: mold

What is claimed is:

1. A composition for nanoimprint comprising:
a cycloolefin-based copolymer;
a polymerizable monomer; and
a photoinitiator,
wherein a content of the polymerizable monomer in the composition is between 1 part by mass and 50 parts by mass with respect to 100 parts by mass of the cycloolefin-based copolymer, and
wherein a solid content concentration is in a range of 1% by mass to 20% by mass.

2. The composition for nanoimprint according to claim 1, wherein the polymerizable monomer includes a polyfunctional monomer.

3. The composition for nanoimprint according to claim 1, wherein the cycloolefin-based copolymer includes a constituent unit having a cyclic olefin and a constituent unit having an acyclic olefin.

4. A cured product which is formed by curing the composition for nanoimprint according to claim 1.

5. A pattern forming method comprising:
coating a substrate with the composition for nanoimprint according to claim 1 to form a pattern forming layer;
pressing a mold, on which an uneven structure having a predetermined pattern is formed, to the pattern forming layer and deforming the pattern forming layer to the predetermined pattern;
exposing the pattern forming layer to light in a state where the mold is pressed; and
peeling the mold pressed to the pattern forming layer.

6. The pattern forming method according to claim 5, further comprising softening the pattern forming layer formed by the coating between the coating and the pressing.

7. An article which has a pattern obtained using the pattern forming method according to claim 5.

* * * * *